United States Patent
Jang et al.

(10) Patent No.: US 10,117,367 B2
(45) Date of Patent: Oct. 30, 2018

(54) FASTENING STRUCTURE FOR SHIELD CAN

(71) Applicants: SAMSUNG ELECTRONICS CO., LTD., Suwon-si, Gyeonggi-do (KR); S-Connect Co., Ltd., Gwangju-si, Gyeonggi-do (KR)

(72) Inventors: Hyun-Tae Jang, Anyang-si (KR); Yong Won Lee, Suwon-si (KR); Jung Je Bang, Gumi-si (KR); Kwang Sub Lee, Yongin-si (KR)

(73) Assignees: SAMSUNG ELECTRONIC CO., LTD., Suwon-si (KR); S-CONNECT CO., LTD., Gwangju-si (KR)

( * ) Notice: Subject to any disclaimer, the term of this patent is extended or adjusted under 35 U.S.C. 154(b) by 230 days.

(21) Appl. No.: 14/625,104

(22) Filed: Feb. 18, 2015

(65) Prior Publication Data

US 2015/0245543 A1    Aug. 27, 2015

(30) Foreign Application Priority Data

Feb. 21, 2014 (KR) .......................... 10-2014-0020826

(51) Int. Cl.
 *H05K 9/00* (2006.01)
(52) U.S. Cl.
 CPC .................................. *H05K 9/0032* (2013.01)
(58) Field of Classification Search
 CPC .................................................... H05K 9/0032
 See application file for complete search history.

(56) References Cited

U.S. PATENT DOCUMENTS 5,844,784 A * 12/1998 Moran ................. H05K 9/0032
                                                                     174/372
6,377,472 B1 * 4/2002 Fan ...................... H05K 9/0032
                                                                     174/379

(Continued)

FOREIGN PATENT DOCUMENTS

CN           1656865         8/2005
CN           1816272         8/2006
              (Continued)

OTHER PUBLICATIONS

Chinese Office Action dated Jun. 19, 2018 in Chinese Patent Application No. 201510086460.5.

*Primary Examiner* — William H Mayo, III
*Assistant Examiner* — Hiram E Gonzalez
(74) *Attorney, Agent, or Firm* — Staas & Halsey LLP

(57) ABSTRACT

A fastening structure for a shield can is capable of ensuring easy attachment/detachment of the shield can and prevents deformation caused by excessive impact when the shield can is attached and detached by improving the fastening structure for a shield can fixed to a printed circuit board. The fastening structure for a shield can provided to shield a printed circuit board on which electronic components are mounted and the electronic components from electromagnetic waves includes a frame provided with a fixing part allowing the frame to be fixed to the printed circuit board, a shield cover provided to surround an outer side of the frame, fastening parts provided at the shield cover and the frame, respectively, such that the shield cover and the frame are attached/detached to/from each other. The fastening parts and the fixing part are disposed without overlapping each other.

25 Claims, 7 Drawing Sheets

(56) References Cited

U.S. PATENT DOCUMENTS

| | | | | |
|---|---|---|---|---|
| 7,746,666 | B2* | 6/2010 | Kakinoki | H05K 9/0032 |
| | | | | 361/816 |
| 9,462,732 | B2* | 10/2016 | Robinson | H05K 9/0032 |
| 2007/0012479 | A1* | 1/2007 | Vinokor | H05K 9/0039 |
| | | | | 174/382 |
| 2007/0210082 | A1* | 9/2007 | English | H05K 9/0032 |
| | | | | 220/4.21 |
| 2009/0067149 | A1* | 3/2009 | Bogursky | H01L 23/552 |
| | | | | 361/816 |
| 2010/0053926 | A1* | 3/2010 | Shi | H05K 9/0032 |
| | | | | 361/816 |
| 2013/0033843 | A1* | 2/2013 | Crotty, Jr. | H05K 9/0032 |
| | | | | 361/807 |

FOREIGN PATENT DOCUMENTS

| | | |
|---|---|---|
| CN | 101395980 | 3/2009 |
| CN | 102238859 | 11/2011 |
| CN | 103582404 | 2/2014 |

* cited by examiner

FASTENING STRUCTURE FOR SHIELD CAN

CROSS-REFERENCE TO RELATED APPLICATIONS

This application claims the benefit of Korean Patent Application No. 10-2014-0020826, filed on Feb. 21, 2014 in the Korean Intellectual Property Office, the disclosure of which is incorporated herein by reference.

BACKGROUND

1. Field

Embodiments of the disclosure relate to a fastening structure for a shield can for shielding electromagnetic waves generated from components or parts mounted on a printed circuit board of various electronic units.

2. Description of the Related Art

In general, electronic devices or communication devices may be equipped with various types of contents or components, and a printed circuit board may be provided to electrically connect the contents or components. When such an electronic device or communication device is used, harmful electric waves may be generated from various electronic function groups mounted on the printed circuit board.

There exists an electromagnetic compatibility (EMC) test to examine whether electromagnetic waves, which is one of the kinds of electric waves which is regulated to determine or ascertain its potential for harmfulness (e.g., to humans), are suitable for an external environment. The EMC has two issues to which it is directed.

Generally, the two issues are divided into analyzing electromagnetic interference (EMI) and analyzing electromagnetic susceptibility (EMS), such that electromagnetic waves are strictly regulated for its harmfulness to humans.

According to such strict regulation according to the EMC test, various units (devices) or methods have been suggested to prevent electromagnetic waves.

For example, in order to shield electromagnetic waves generated from various devices on a printed circuit board used for a mobile terminal, a method of coating paint through an EMI spray or a vacuum deposition, or a method of mounting a shield can on a printed circuit board have been suggested.

The above methods may be used in a combined manner, but the shield can generally used in most applications. In particular, various methods of mounting a shield can on a printed circuit board have been provided and classified into a mechanical coupling method, a clip type coupling method and a frame type coupling method.

SUMMARY

Therefore, it is an aspect of the disclosure to provide a fastening structure for a shield can, capable of ensuring easy attachment/detachment of the shield can by improving the fastening structure for a shield can fixed to a printed circuit board.

It is another aspect of the disclosure to provide a fastening structure for a shield can, capable of achieving slimness by minimizing the height of a shield can.

It is another aspect of the disclosure to provide a fastening structure for a shield can, capable of improving shielding characteristics.

It is another aspect of the disclosure to provide a fastening structure for a shield can, capable of preventing deformation caused by excessive impact when a shield can is attached and detached.

Additional aspects of the disclosure will be set forth in part in the description which follows and, in part, will be apparent from the description, or may be learned by practice of the disclosure.

In accordance with an aspect of the disclosure, a fastening structure for a shield can may be provided to shield a printed circuit board on which electronic components are mounted and the electronic components from electromagnetic waves. The fastening structure may include: a frame provided with a fixing part allowing the frame to be fixed to the printed circuit board, a shield cover provided to surround an outer side of the frame, and fastening parts provided at the shield cover and the frame, respectively, such that the shield cover and the frame are attached/detached to/from each other. The fastening parts and the fixing part may be disposed without overlapping each other.

The fastening parts may include: a first fastening part provided on the frame, and a second fastening part provided on the shield cover while corresponding to the first fastening part.

The frame may include an upper surface, and a frame lateral side part bent downward from an edge of the upper surface, wherein the fixing part may be formed at a lower end of the frame lateral side part.

The first fastening part and the fixing part may be alternately disposed at the frame lateral side part.

The first fastening part may have a height which is smaller than a height of the fixing part at the frame lateral side part.

The fixing part may include at least one of a soldering fastening, a bonding fastening, a clip fastening and a screw fastening.

The first fastening part may include a fastening groove that is depressed from the frame lateral side part.

The fastening groove may include at least one of a circle, a semicircle, and an ellipse.

The fastening groove may include a slit part formed by slitting at least one portion of a lower end of the fastening groove.

The shield cover may include: a shield cover surface, and a shield cover lateral side part bent downward from an edge of the shied cover surface, wherein a plurality of slots may be formed by slitting the shield cover lateral side part downward.

The second fastening part may include a fastening protrusion formed at the shield cover lateral side part in a shape corresponding to the fastening groove.

The second fastening part may have a height which is larger than a height of the shield cover lateral side part.

The second fastening part may have a height equal to or smaller than a height of the fixing part.

In accordance with an aspect of the disclosure, a fastening structure for a shield can may be provided to shield a printed circuit board on which electronic components are mounted and the electronic components from electromagnetic waves. The fastening structure may include: a frame provided with a fixing part allowing the frame to be fixed to the printed circuit board, a shield cover provided at the shield can to surround an outer side of the frame, and fastening parts provided at the shield cover and the frame, respectively, such that the shield cover and the frame are attached/detached to/from each other. The fastening part and the fixing part may be disposed without overlapping each other, and the fastening parts may have a height equal to or smaller than a height of the fixing part.

The fasting parts may include a first fastening part provided on a lateral side of the frame, and a second fastening part provided on the shield cover while corresponding to the first fastening part.

The first fastening part may have a height smaller than a height of the fixing part at the frame.

The first fastening part may include a fastening groove that is depressed from the lateral side of the frame.

The fastening groove may include at least one of a circle, a semicircle, and an ellipse.

The fastening groove may include a slit part formed by slitting at least one portion of a lower end of the fastening groove.

The second fastening part may include a fastening protrusion formed in a shape corresponding to the fastening groove.

In accordance with an aspect of the disclosure, a printed circuit board may include at least one electronic component mounted on the printed circuit board and a shield can disposed to cover at least a portion of the at least one electronic component to shield electromagnetic waves generated by the at least one electronic component. The shield can may include a frame including a fixing part to fix the frame to the printed circuit board, a shield cover disposed to surround an outer side of the frame, and fastening parts disposed at the shield cover and the frame, respectively, such that the shield cover and the frame are attachable to each other and detachable from each other. The fastening parts may have a height which is equal to or smaller than a height of the fixing part.

The frame may include an upper surface, a frame lateral side part bent downward from an edge of the upper surface, and a plurality of fixing parts are disposed at intervals along a lower portion of the frame lateral side part. The shield cover may include a shield cover surface, a shield cover lateral side part bent downward from an edge of the shield cover surface, and a plurality of slots formed by slitting the shield cover lateral side part downward.

The fastening parts may include a plurality of first fastening parts disposed at intervals along the lower portion of the frame lateral side part, and between adjacent fixing parts, and a plurality of second fastening parts disposed at intervals along the shield cover lateral side part to correspond to the plurality of first fastening parts.

The plurality of first fastening parts may include grooves which protrude toward an inside of the frame, and the plurality of second fastening parts may include protrusions which protrude outward from an inside of the shield cover lateral side part to be fastened to the corresponding grooves.

The height of the fixing parts may be greater than a height of the shield cover lateral side part.

As described above, the shield can may be easily attached and detached, and deformation caused by excessive shock when a shield can is attached and detached may be prevented by improving the fastening structure of the shield can fixed to the printed circuit board.

Slimness is achieved by minimizing the height of the shield can.

Electromagnetic waves shielding characteristics are improved.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
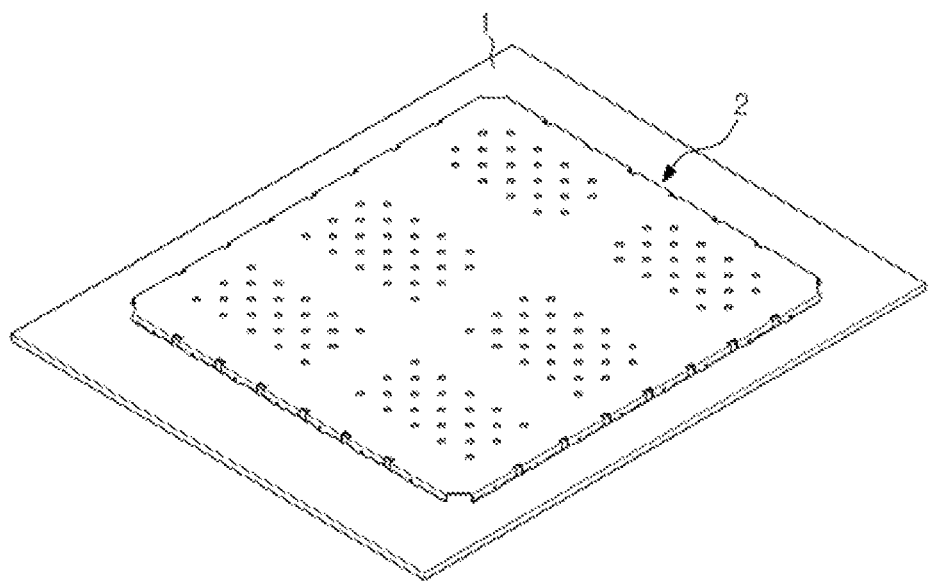
FIG. 1 is a perspective view schematically illustrating a printed circuit board on which a shield can is mounted in accordance with an embodiment of the disclosure.

Reference will now be made in detail to the embodiments of the disclosure, examples of which are illustrated in the accompanying drawings, wherein like reference numerals refer to like elements throughout.

Figure 2:
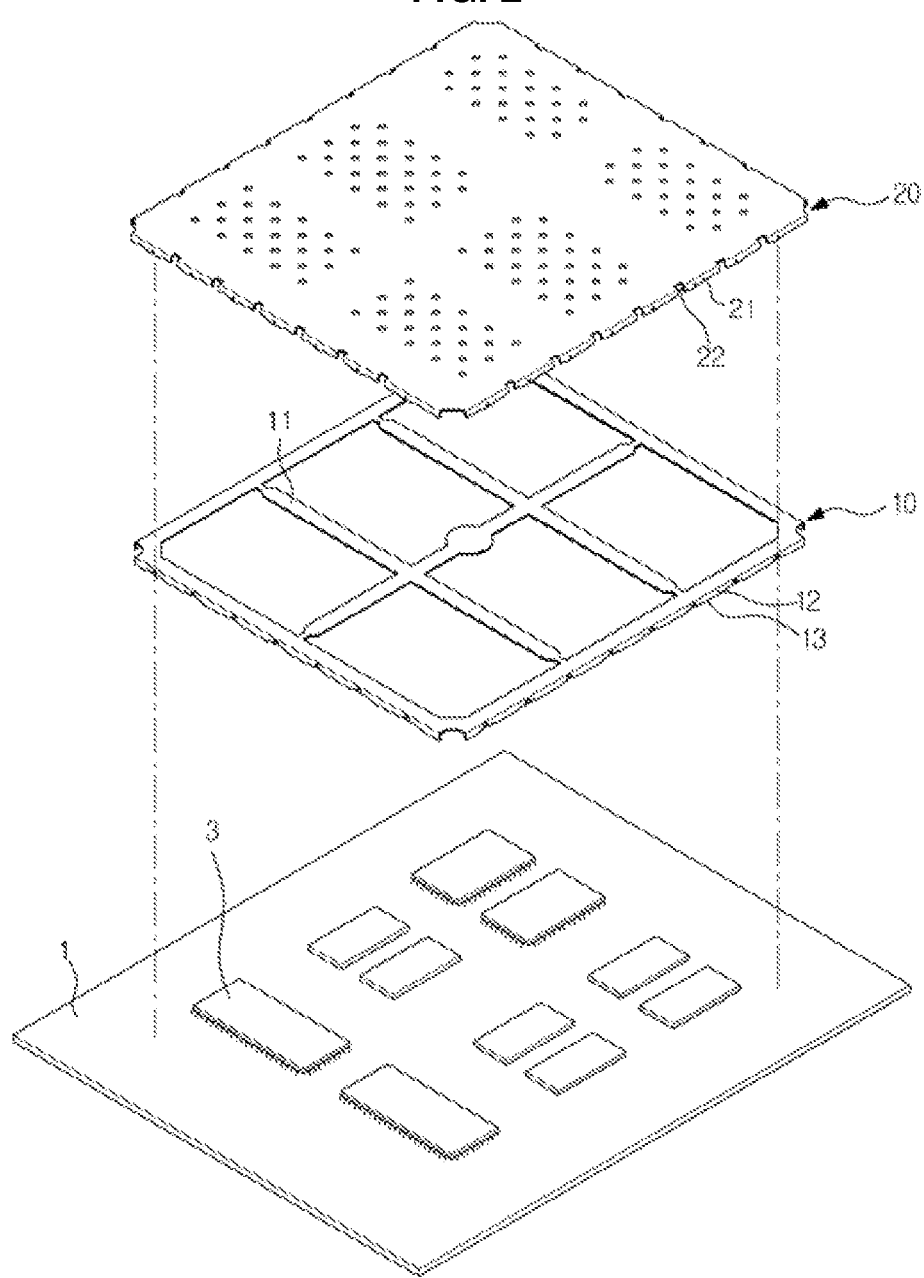
FIG. 2 is an exploded perspective view illustrating a shield can mounted on a printed circuit board in accordance with an embodiment of the disclosure.
Figure 3:
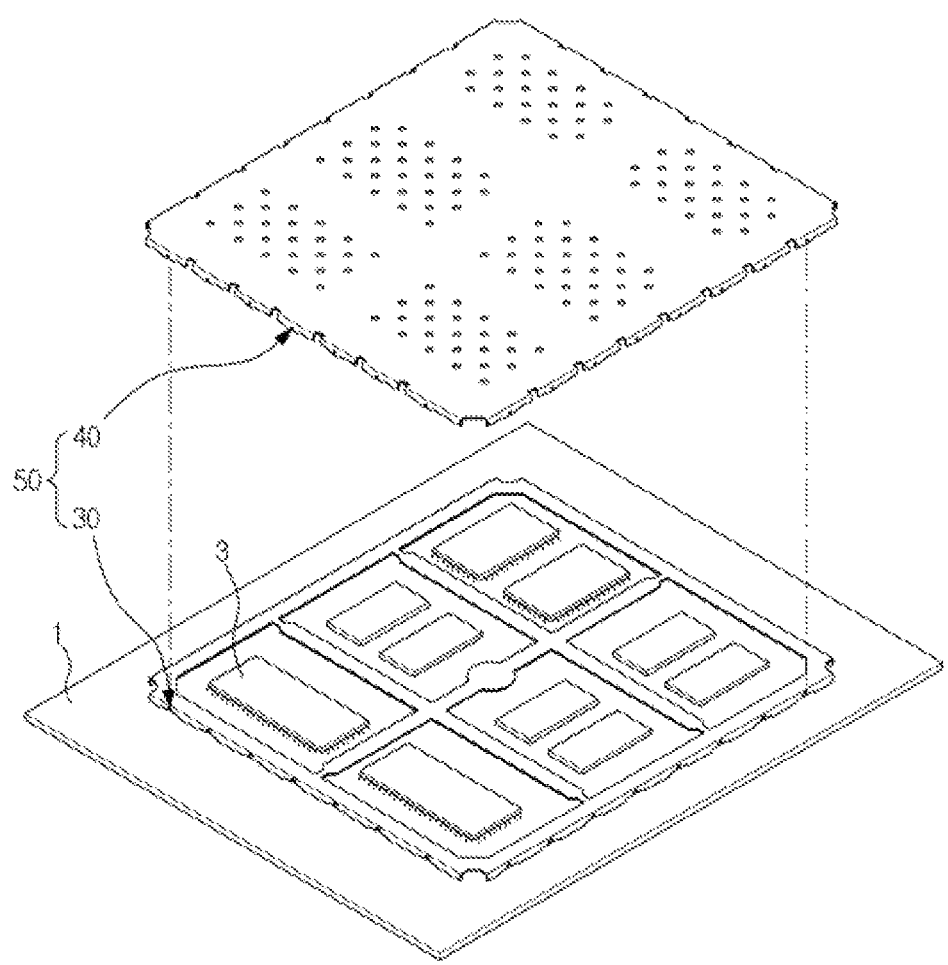
FIG. 3 is an exploded perspective view illustrating a fastening structure for a shield can in accordance with the embodiment of the disclosure.

FIG. 1 is a perspective view schematically illustrating a printed circuit board on which a shield can is mounted in accordance with an embodiment of the disclosure, FIG. 2 is an exploded perspective view illustrating a shield can mounted on a printed circuit board in accordance with an embodiment of the disclosure, and FIG. 3 is an exploded perspective view illustrating a fastening structure for a shield can in accordance with the embodiment of the disclosure.

Referring to FIGS. 1 to 3, various electronic components (electronic function groups) 3, such as a semiconductor device, may be mounted on a printed circuit board 1, and a shield can 2 may be provided at an outer side of the electronic components 3 to cover an outer side of the electronic components 3 to shield electromagnetic interference generated from the electronic components 3.

The shield can 2 may include a frame 10 fixed to the printed circuit board 1, and a shield cover 20 configured to surround an outer side of the frame 10.

Through a shield can fastening structure with respect to the frame 10, the shield cover 20 may be provided so as to be attached/detached to/from the printed circuit board 1.

The shield can 2 may be provided to cover an upper surface of the electronic components 3 mounted on the printed circuit board 1, and may be formed of a conductive material to shield noise.

The frame 10 and the shield cover 20 may be provided with fastening parts 50, respectively, for mutual attachment/detachment.

The fastening parts 50 may include a first fastening part 30 provided at a lateral side of the frame 10, and a second fastening part 40 provided on the shield cover 20.

The second fastening part 40 may be formed at a position corresponding to a position of the first fastening part 30.

The frame 10 may include a fixing part 13 allowing the frame 10 to be fixed to the printed circuit board 1.

The fixing part 13 may include a plurality of fixing parts 13 being spaced apart from each other by a predetermined interval at a lower end of the lateral side of the frame 10.

Although the fixing part 13 may be implemented through soldering, the disclosure is not limited thereto and may be implemented in various methods as long as the fixing part is able to fix the frame to the printed circuit board. For example, the fixing part 13 may enable the frame 10 to be fixed to the printed circuit board 1, by for example, bonding, clip or screw fastening, and the like. For example, generally a fastening member may include a screw, a bolt, a pin, a clip, a rivet, an anchor, an adhesive, and the like. The plurality of fixing parts may be spaced apart from each other by a regular interval such that the plurality of fixing parts may be spaced apart from one another by a equal distance. The plurality of fixing parts may be spaced apart from each other by irregular intervals such that at least some of the plurality of fixing parts may be spaced apart from one another by different distances. A width of each of the fixing parts on one or more sides of the frame may be the same as one another, or may be different from one another. Likewise, a width of each of the first fastening parts on one or more sides of the frame may be the same as one another, or may be different from one another.

The fastening parts 50 provided on the frame 10 and the shield cover 20 may be disposed without overlapping with the fixing part 13 of the frame 10, to prevent the frame 10 from interfering with the shield cover 20 at the time of fastening for attachment/detachment of the frame 10 and the shield cover 20 and at the time of fixing the shield can to the printed circuit board 10.

Although the fastening parts 50 configured to fasten the shield cover 20 and the frame 10 to each other are illustrated as being formed to include a total of eight fastening parts 50 at one side of the shield can 2 having a square shape, the disclosure is not limited thereto. For example, the fastening parts may be provided in various sizes and number depending on the size and shape of the shield can. For example, there may be less than eight fastening parts or more than eight fastening parts. The number of fastening parts (as well as the size of the shield can) may be determined by the size of the printed circuit board, by the number of electrical components to be shielded, etc. The width of the fastening parts may also determine how many fastening parts may be arranged on any one side of the frame and/or shield cover. The shield can and/or frame may have a square shape, rectangular shape, circular shape, oval shape, or generally any polygonal or geometric shape, which may be used to cover a portion or all of the electrical components on the printed circuit board. There may be a plurality of shield cans and corresponding frames arranged or disposed on the printed circuit board to cover a plurality of groups of electrical components.

Figure 4:
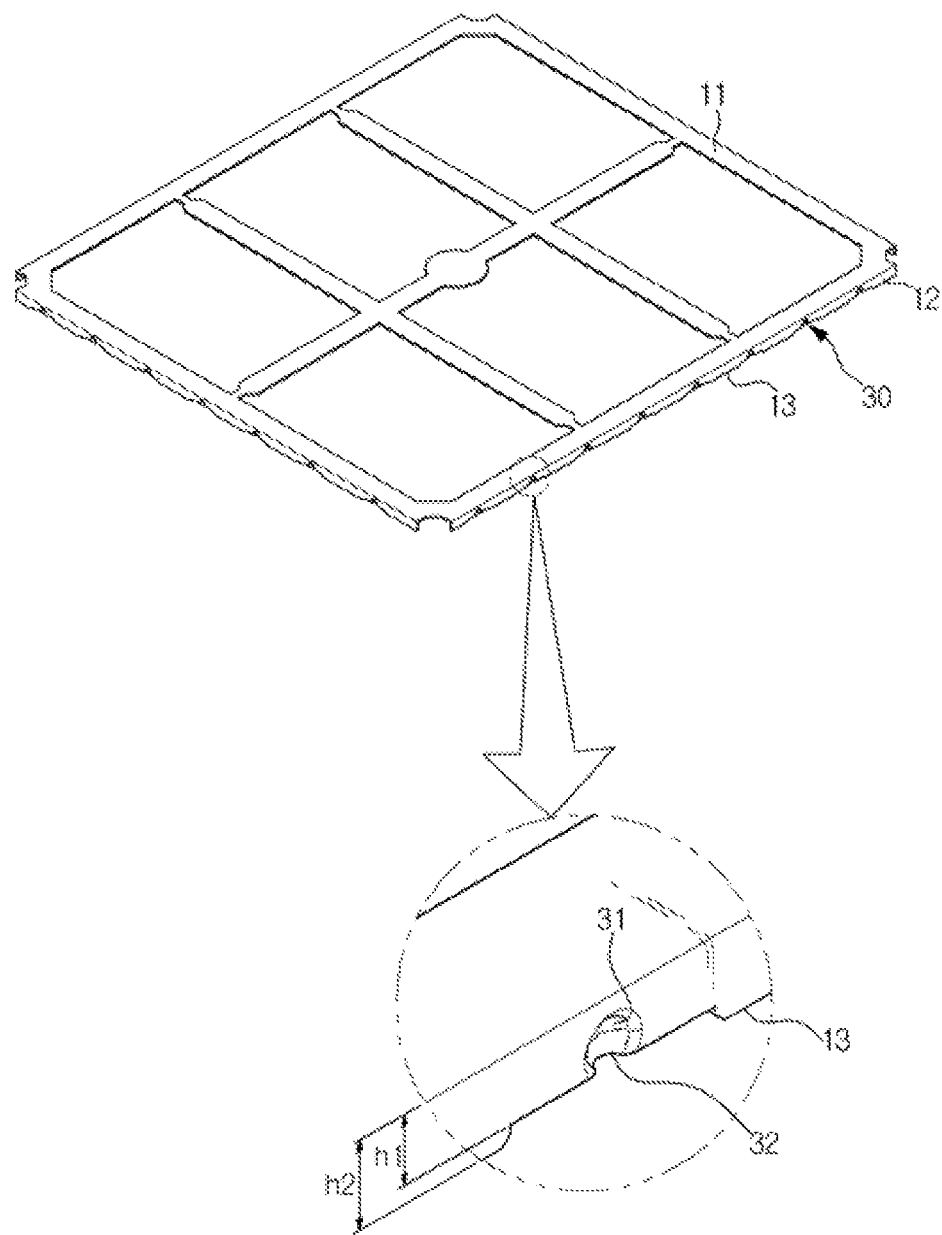
FIG. 4 is a schematic view illustrating a frame of a fastening structure for a shield can in accordance with an embodiment of the disclosure.
Figure 5:
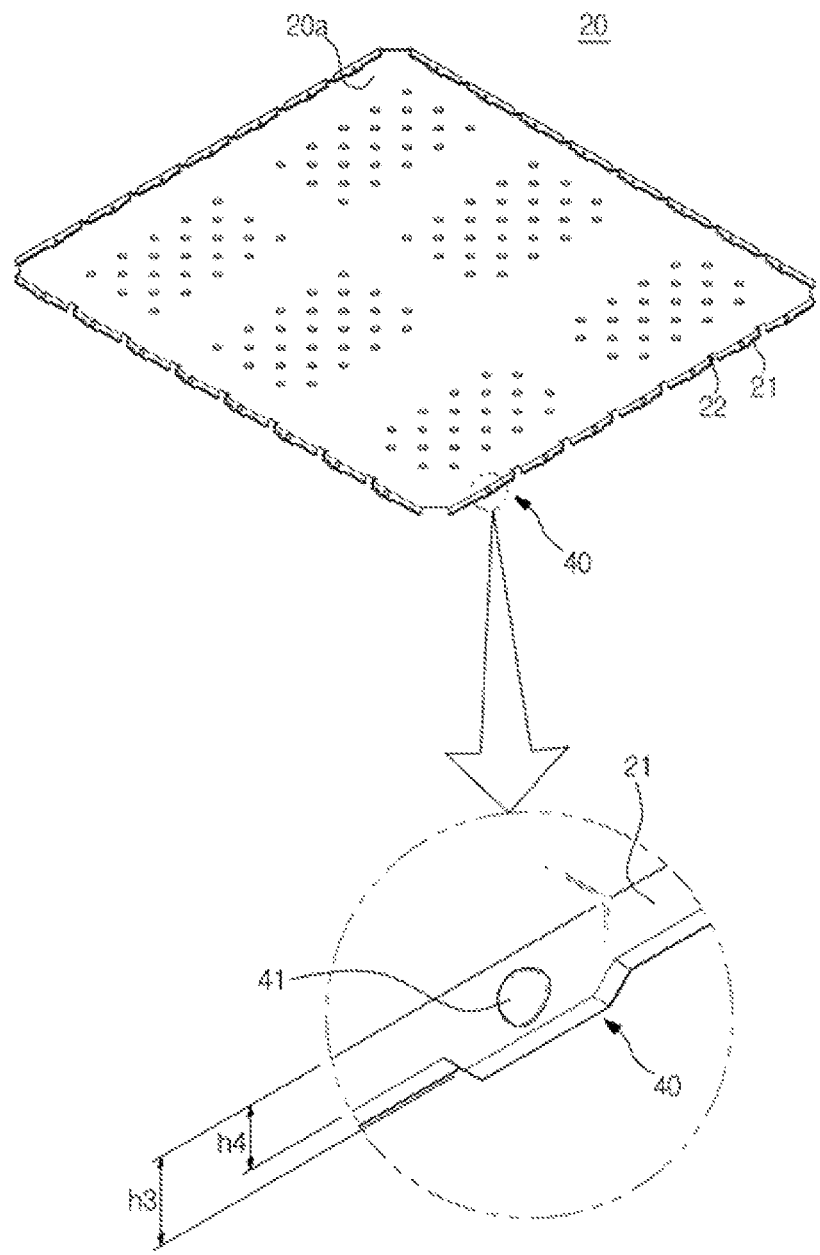
FIG. 5 is a schematic view illustrating a shield cover in accordance with an embodiment of the disclosure.
Figure 6:
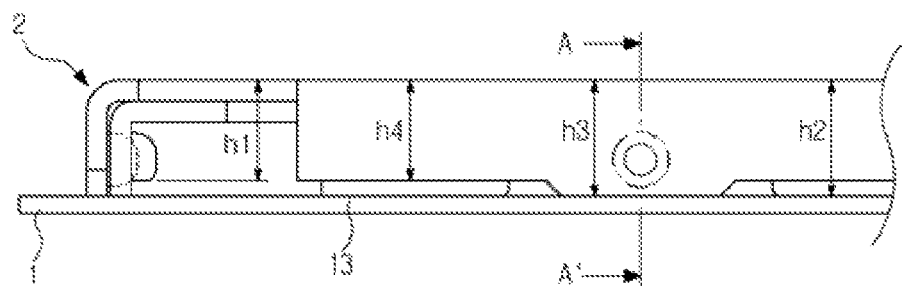
FIG. 6 is a side view illustrating a frame coupled to a shield cover in accordance with an embodiment of the disclosure.
Figure 7:
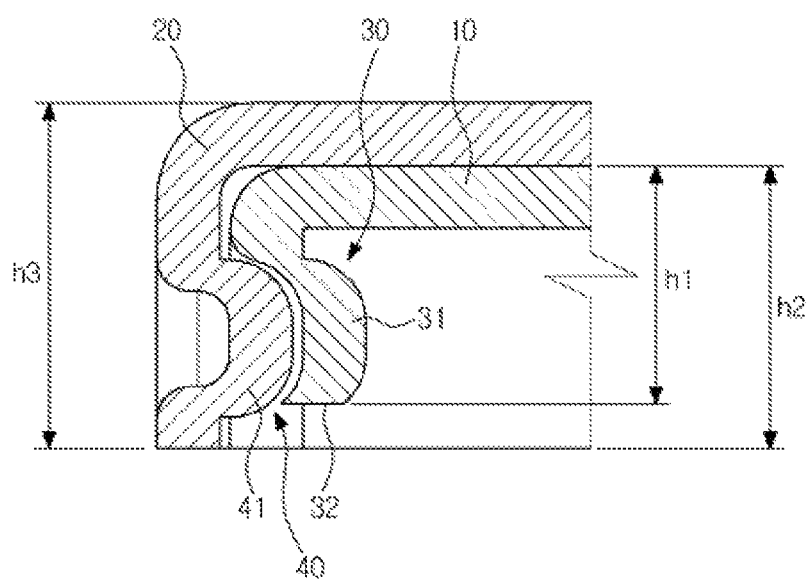
FIG. 7 is a cross sectional view taken along line A-A' of FIG. 6

FIG. 4 is a schematic view illustrating a frame of a fastening structure for a shield can in accordance with an embodiment of the disclosure, FIG. 5 is a schematic view illustrating a shield cover in accordance with an embodiment of the disclosure FIG. 6 is a side view illustrating a frame coupled to a shield cover in accordance with an embodiment of the disclosure, and FIG. 7 is a cross sectional view taken along line A-A' of FIG. 6.

Referring to FIGS. 4 to 7, the frame 10 fixed to the printed circuit board 1 may be disposed at an outside of the electronic components 3 such that the shield can 2 surrounds the outer side of the electronic components 3.

The frame 10 may include an upper surface 11, frame lateral side parts 12 bent downward from edges of the upper surface 11, and a plurality of first fastening parts 30 formed at the frame lateral side part 12.

The first fastening part 30 may include a fastening groove 31 formed at the frame lateral side part 12. The fastening groove 31 may protrude toward inside of the frame 10.

The fastening groove 31 may be provided in the shape of at least one of a circle, a semicircle, and an ellipse. However, the disclosure is not so limited, and the fastening groove may be shaped differently, for example, in a square shape, rectangular shape, etc.

The fastening groove 31 may include a slit part 32 that is formed by slitting at least one portion of a lower end of the fastening groove 31. The slit part 32 may be formed at the lower end of the fastening groove 31, and the fastening groove 31 may have a height h1 which is smaller than a height h2 of the fixing part 13 of the frame 10 due to the slit part 32.

The shield cover 20 may include a shield cover surface 20a, shield cover lateral side parts 21 bent downward from edges of the shield cover surface 20a, a plurality of slots 22 disposed between the shield cover lateral side parts 21 while being spaced apart from each other, and a second fastening part 40 formed in the middle or central portion of the shield cover lateral side part 21.

The slot 22 may be formed by vertically slitting the shield cover lateral side part 21 from a lower end of the shield cover lateral side part 21 to a periphery of the shield can 2, and may include a plurality of slots 22 being spaced apart from each other by a predetermined interval. The plurality of slots may be spaced apart from each other by a regular interval such that the plurality of slots may be spaced apart from one another by a equal distance. The plurality of slots may be spaced apart from each other by irregular intervals such that at least some of the plurality of slots may be spaced apart from one another by different distances. Likewise, a width of each of the shield cover later side parts on one or more sides of the shield cover may be the same as one another, or may be different from one another. Likewise, a width of each of the second fastening parts on one or more sides of the shield cover may be the same as one another, or may be different from one another.

The second fastening part 40 may be formed at a position corresponding to the first fastening part 30 of the frame 10.

The second fastening part 40 may include a fastening protrusion 41 protruding inward from the shield cover lateral side part 21 (i.e., protruding inward toward the frame by protruding outward from an inside or interior surface of the shield cover lateral side part 21 as shown in FIG. 6 and FIG. 7, for example) so as to correspond to the first fastening part 30.

Accordingly, the fastening protrusion 41 may be provided in the form of at least one of a circle, a semicircle, and an ellipse so as to correspond to the fastening groove 31. However, the disclosure is not so limited, and the fastening protrusion may be shaped differently, for example, in a square shape, rectangular shape, etc., so as to correspond to a shape of the fastening groove.

Meanwhile, the second fastening part 40 may have a height h3 which is larger than a height h4 of the shield cover lateral side part 21, and which is equal to or smaller than the height h2 of the fixing part 13 of the frame 10.

As described above, the height h3 of the second fastening part 40 of the shield cover 20 may be formed to be smaller than the height h2 of the fixing part 13 of the frame 10, and to be larger than the height h4 of the shield cover lateral side part 21 of the shield cover 20, so that the overall height of the shield can 2 mounted on the printed circuit board 1 is reduced, thereby achieving slimness.

Meanwhile, as the fastening protrusion 41 of the shield cover 20 is inserted into the fastening groove 31 of the frame 10, the frame 10 is fastened to the shield cover 20.

For example, since the first fastening part 30 is provided with the slit part 32 formed at the lower portion of the fastening groove 31, the fastening protrusion 41 of the second fastening part 40 may be easily separated from the fastening groove 31.

When the frame 10 is coupled to the shield cover 20, the height h4 of the shield cover lateral side part 21 of the shield cover 20 and the height h1 of the fastening groove 31 may be provided at the same level. Also, when the frame 10 is coupled to the shield cover 20, the height h3 of the second fastening part 40 of the shield cover 20 and the height h2 of the fixing part 13 of the frame 10 may be provided at the same or substantially the same level. Accordingly, when the shield can is bonded (or fixed, coupled, adhered to, etc.) to the printed circuit board 1, a gap or space between the shield cover 20 and the printed circuit board 1 may be minimized.

As shown in FIG. 4, a first fastening part 30 may include a fastening groove and slit part, and as shown in FIG. 5, a second fastening part 40 may include a fastening protrusion which is disposed so as to correspond to the fastening groove and slit part of the first fastening part 30. Fastening grooves and slit parts may be arranged or disposed on every first fastening part or only on some of the first fastening parts (e.g., every other first fastening part). Likewise, fastening protrusions may be arranged or disposed on every second fastening part or only on some of the second fastening parts (e.g., every other second fastening part).

Although embodiments of the disclosure have been shown and described, it would be appreciated by those skilled in the art that changes may be made to these embodiments without departing from the principles and spirit of the disclosure, the scope of which is defined in the claims and their equivalents.

What is claimed is:

1. A fastening structure for a shield can to shield electromagnetic waves, the fastening structure comprising:
    a frame provided with a fixing part to fix the frame to a printed circuit board;
    a shield cover provided to surround an outer side of the frame;
    fastening parts including a first fastening part provided at the frame and a second fastening part provided at the shield cover, to correspond to the first fastening part, such that the shield cover and the frame are attachable to each other and detachable from each other,
    wherein the fastening parts and the fixing part are disposed without overlapping each other,
    the shield cover includes:
        a shield cover upper surface, and
        a shield cover lateral side, bent downward from an edge of the shield cover upper surface, having a plurality of slots and a plurality of shield cover lateral side parts respectively provided between a corresponding pair of slots among the plurality of slots,
        each shield cover lateral side part includes:
            a first portion, a first side of the first portion bordering a first slot among the plurality of slots and extending downward from an edge of the shield cover upper surface, and a lower side of the first portion extending laterally away from a lower end part of the first side of the first portion, and
            a second portion, a first side of the second portion bordering a second slot among the plurality of slots and extending downward from the edge of the shield cover upper surface and a lower side of the second portion extending laterally away from a lower end part of the first side of the second portion and toward the first portion,
    the second fastening part is provided between the first portion and the second portion of a corresponding shield cover lateral side part among the plurality of shield cover lateral side parts to extend downward on opposite sides thereof in a tapered fashion from the corresponding shield cover lateral side part among the plurality of shield cover lateral side parts, and
    the second fastening part includes:
        a third portion extending in a downward inclined fashion from the lower side of the first portion and away from the lower side of the first portion,
        a fourth portion extending laterally from a lower end part of the third portion, and
        a fifth portion extending in an upward inclined fashion from an end part of the fourth portion and away from the fourth portion, to intersect with an end part of the lower side of the second portion,
    wherein a height of the second fastening part is lower than a height of the fixing part of the frame and higher than a height of the shield cover lateral side, and
    the height of the shield cover lateral side is equal to the height of the fixing part of the frame when the frame is coupled to the shield cover.

2. The fastening structure of claim 1, wherein the second fastening part has a same height as the fixing part so that a gap between the shield cover and the printed circuit board is minimized.

3. The fastening structure of claim 1, wherein the frame comprises:
    an upper surface; and
    a frame lateral side part bent downward from an edge of the upper surface,
    wherein the fixing part is formed at a lower end of the frame lateral side part.

4. The fastening structure of claim 3, wherein the first fastening part and the fixing part are alternately disposed at the frame lateral side part.

5. The fastening structure of claim 3, wherein the first fastening part has a height which is smaller than a height of the fixing part at the frame lateral side part.

6. The fastening structure of claim 3, wherein the first fastening part comprises a fastening groove that is depressed from the frame lateral side part.

7. The fastening structure of claim 6, wherein the fastening groove is depressed in the shape of at least one of a circle, a semicircle, and an ellipse.

8. The fastening structure of claim 6, wherein the fastening groove includes a slit part formed by slitting at least a portion of a lower end of the fastening groove.

9. The fastening structure of claim 1, wherein the fixing part includes at least one of a soldering fastening, a bonding fastening, a clip fastening and a screw fastening.

10. The fastening structure of claim 1, wherein
    the second fastening part includes a fastening protrusion provided centrally with respect to the corresponding shield cover lateral side part in a lateral direction.

11. The fastening structure of claim 1, wherein the second fastening part includes a fastening protrusion provided in a shape corresponding to a fastening groove provided in a frame lateral side part of the first fastening part.

12. The fastening structure of claim 1, wherein the second fastening part has a height which is larger than a height of the corresponding shield cover lateral side part.

13. The fastening structure of claim 1, wherein the second fastening part has a height which is equal to or smaller than a height of the fixing part.

14. A fastening structure for a shield can to shield electromagnetic waves, the fastening structure comprising:
a frame provided with a fixing part to fix the frame to a printed circuit board;
a shield cover provided at the shield can to surround an outer side of the frame;
fastening parts including a first fastening part provided at the frame, and a second fastening part provided at the shield cover, such that the shield cover and the frame are attachable to each other and detachable from each other,
wherein the fastening parts and the fixing part are disposed without overlapping each other,
the shield cover includes:
a shield cover upper surface, and
a shield cover lateral side, bent downward from an edge of the shield cover upper surface, having a plurality of slots and a plurality of shield cover lateral side parts respectively provided between a corresponding pair of slots among the plurality of slots,
each shield cover lateral side part includes:
a first portion, a first side of the first portion bordering a first slot among the plurality of slots and extending downward from an edge of the shield cover upper surface, and a lower side of the first portion extending laterally away from a lower end part of the first side of the first portion, and
a second portion, a first side of the second portion bordering a second slot among the plurality of slots and extending downward from the edge of the shield cover upper surface and a lower side of the second portion extending laterally away from a lower end part of the first side of the second portion and toward the first portion,
the second fastening part is provided between the first portion and the second portion of a corresponding shield cover lateral side part among the plurality of shield cover lateral side parts to extend downward on opposite sides thereof in a tapered fashion from the corresponding shield cover lateral side part among the plurality of shield cover lateral side parts,
the second fastening part includes:
a third portion extending in a downward inclined fashion from the lower side of the first portion and away from the lower side of the first portion,
a fourth portion extending laterally from a lower end part of the third portion, and
a fifth portion extending in an upward inclined fashion from an end part of the fourth portion and away from the fourth portion, to intersect with an end part of the lower side of the second portion, and
the first and second fastening parts have a height which is equal to or smaller than a height of the fixing part,
wherein a height of the second fastening part is lower than a height of the fixing part of the frame and higher than a height of the shield cover lateral side, and
the height of the shield cover lateral side is equal to the height of the fixing part of the frame when the frame is coupled to the shield cover.

15. The fastening structure of claim 14, wherein the first fastening part has a height less than the fixing part.

16. The fastening structure of claim 15, wherein the first fastening part has a height which is equal to a height of the corresponding shield cover lateral side part.

17. The fastening structure of claim 15, wherein the first fastening part comprises a fastening groove that is depressed from the lateral side of the frame.

18. The fastening structure of claim 17, wherein the fastening groove is depressed in the shape of at least one of a circle, a semicircle, and an ellipse.

19. The fastening structure of claim 17, wherein the fastening groove includes a slit part formed by slitting at least a portion of a lower end of the fastening groove.

20. The fastening structure of claim 17, wherein the second fastening part includes a fastening protrusion formed in a shape corresponding to the fastening groove.

21. A printed circuit board, comprising:
at least one electronic component mounted on the printed circuit board; and
a shield can disposed to cover at least a portion of the at least one electronic component to shield electromagnetic waves generated by the at least one electronic component,
wherein the shield can includes:
a frame including a fixing part to fix the frame to the printed circuit board;
a shield cover disposed to surround an outer side of the frame; and
fastening parts including a first fastening part disposed at the frame and a second fastening part disposed at the shield cover, such that the shield cover and the frame are attachable to each other and detachable from each other,
wherein
the fastening parts have a height which is equal to or smaller than a height of the fixing part,
the shield cover includes:
a shield cover upper surface, and
a shield cover lateral side, bent downward from an edge of the shield cover upper surface, having a plurality of slots and a plurality of shield cover lateral side parts respectively provided between a corresponding pair of slots among the plurality of slots,
each shield cover lateral side part includes:
a first portion, a first side of the first portion bordering a first slot among the plurality of slots and extending downward from an edge of the shield cover upper surface, and a lower side of the first portion extending laterally away from a lower end part of the first side of the first portion, and
a second portion, a first side of the second portion bordering a second slot among the plurality of slots and extending downward from the edge of the shield cover upper surface and a lower side of the second portion extending laterally away from a lower end part of the first side of the second portion and toward the first portion,
the second fastening part is provided between the first portion and the second portion of a corresponding shield cover lateral side part among the plurality of shield cover lateral side parts to extend downward on opposite sides thereof in a tapered fashion from the corresponding shield cover lateral side part among the plurality of shield cover lateral side parts, and
the second fastening part includes:
a third portion extending in a downward inclined fashion from the lower side of the first portion and away from the lower side of the first portion, a fourth portion extending laterally from a lower end part of the third portion, and a fifth portion extending in an upward inclined fashion from an end part of the fourth portion and away from the fourth portion, to intersect with an end part of the lower side of the second portion, wherein a height of the second fastening part is lower than a height of the fixing part of the frame and higher than a height of the shield cover lateral side, and the height of the shield cover lateral side is equal to the height of the fixing part of the frame when the frame is coupled to the shield cover.

22. The printed circuit board of claim 21, wherein:

the frame includes an upper surface, a frame lateral side part bent downward from an edge of the upper surface, and a plurality of fixing parts are disposed at intervals along a lower portion of the frame lateral side part.

23. The printed circuit board of claim 22, wherein a plurality of first fastening parts are disposed at intervals along the lower portion of the frame lateral side part, and between adjacent fixing parts; and a plurality of second fastening parts are disposed at intervals along the shield cover lateral side to correspond to the plurality of first fastening parts.

24. The printed circuit board of claim 23, wherein the plurality of first fastening parts include grooves which protrude toward an inside of the frame, and the plurality of second fastening parts include protrusions which protrude outward from an inside of the shield cover lateral side to be fastened to the corresponding grooves.

25. The printed circuit board of claim 22, wherein a height of the plurality of fixing parts is greater than a height of the shield cover lateral side part.

* * * * *